(12) United States Patent
Gao

(10) Patent No.: US 12,048,127 B2
(45) Date of Patent: Jul. 23, 2024

(54) DISTRIBUTION HARDWARE FOR TWO PHASE SYSTEM RECIRCULATION

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 111 days.

(21) Appl. No.: 17/699,777

(22) Filed: Mar. 21, 2022

(65) Prior Publication Data
US 2023/0301037 A1    Sep. 21, 2023

(51) Int. Cl.
H05K 7/20 (2006.01)

(52) U.S. Cl.
CPC ..... *H05K 7/20809* (2013.01); *H05K 7/20327* (2013.01); *H05K 7/20818* (2013.01); *H05K 7/20272* (2013.01)

(58) Field of Classification Search
CPC ........... H05K 7/20272; H05K 7/20327; H05K 7/203; H05K 7/20772–20781; H05K 7/20809–20818
See application file for complete search history.

(56) References Cited

U.S. PATENT DOCUMENTS

| | | | |
|---|---|---|---|
| 6,499,961 B1 * | 12/2002 | Wyatt | F04B 49/025 417/40 |
| 2008/0066889 A1 * | 3/2008 | Knight | H05K 7/20818 165/104.21 |
| 2014/0124174 A1 * | 5/2014 | Campbell | H05K 7/20809 29/890.035 |
| 2017/0276385 A1 * | 9/2017 | Ide | F22B 1/00 |
| 2021/0168970 A1 * | 6/2021 | Chehade | H05K 7/208 |
| 2021/0222956 A1 * | 7/2021 | Zhang | F28D 15/04 |

* cited by examiner

*Primary Examiner* — Zachary Pape
*Assistant Examiner* — Steven Ngo
(74) *Attorney, Agent, or Firm* — WOMBLE BOND DICKINSON (US) LLP

(57) ABSTRACT

The present disclosure provides apparatus, systems, methods, and techniques for cooling using a fluid management hardware that allows for directly recirculating a liquid portion of two-phase fluids. In a core unit, a merging region is designed for the liquid portion may be merged with supply coolant to return to cooling the system, while the vapor portion may be transferred to external cooling and condensed to liquid to return to the coolant supply source. A pump is directly intaking coolant from the merging region. In an embodiment, the supply coolant may directly connected to the pump intaking loop. The cooling techniques may be applied to an advanced server rack having high power density servers. In some cases, the disclosed design may be used for distributing two phase coolant to servers with either cooling plate/cooling module or the server is immersion based packaged.

18 Claims, 6 Drawing Sheets

DISTRIBUTION HARDWARE FOR TWO PHASE SYSTEM RECIRCULATION

FIELD

This disclosure generally relates to cooling, such as two phase fluid cooling.

BACKGROUND

Cooling (e.g., removing heat, often excessive or unwanted heat) is a prominent factor in a computer system and data center design. The number of high performance electronics components such as high performance processors packaged inside servers has steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime. The data centers therefore often require effective and efficient cooling solutions, especially in the cases of cooling these high performance servers.

Cooling operation efficiency may be measured by the amount of heat removed divided by the input energy required for removing the amount of heat. Therefore, the less input energy is consumed for removing the same amount of heat, the more efficient the cooling solution is. Optimizing coolant management may therefore improve cooling operation efficiency.

BRIEF DESCRIPTION OF THE DRAWINGS

Embodiments of the present disclosure are illustrated by way of example and not limitation in the figures of the accompanying drawings in which like references indicate similar elements.

Like numerals indicate like elements.

DETAILED DESCRIPTION

Figure 1:
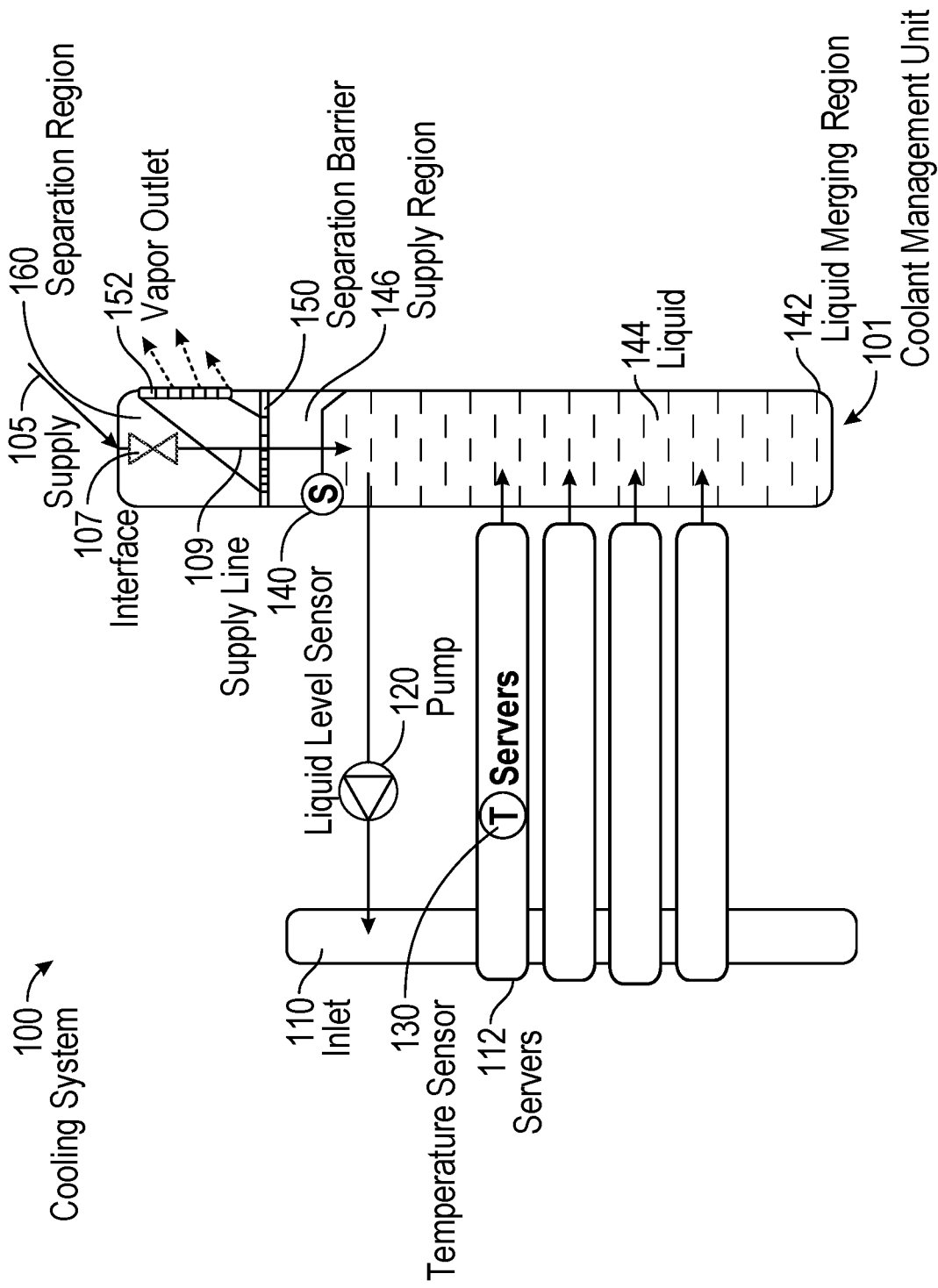
FIG. 1 illustrates a first example schematic of a cooling system using a liquid merging region, according to an embodiment of the present disclosure.

Various embodiments and aspects of the present disclosures will be described with reference to details discussed below, and the accompanying drawings will illustrate the various embodiments. The following description and drawings are illustrative of the present disclosure and are not to be construed as limiting the present disclosure. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the present disclosure. The appearances of the phrase "in one embodiment" in various places in the specification do not necessarily all refer to the same embodiment.

The present disclosure provides apparatus, systems, methods, and techniques for cooling using a fluid management hardware that allows for directly recirculating a liquid portion of two-phase fluids. Aspects of the present disclosure use the term "two-phase" fluid(s) or coolant(s) to refer to any fluid that may be transformed into a mixture of at least two phases of fluids (e.g., liquid and vapor), any fluid that includes a mixture of at least two phases of fluids, and any fluid that may be used in two-phase cooling systems (e.g., as opposed to single-phase cooling systems).

In one embodiment, a two-phase coolant includes a liquid portion and a vapor portion after absorbing heat. In a core unit, the liquid portion may be merged with supply coolant to return to cooling the system, while the vapor portion may be transferred for external cooling and return to the coolant supply source as liquid. The cooling techniques may be applied to an advanced server rack having high power density servers. In some cases, the disclosed design may be used for distributing two phase coolant to servers with either cooling plate/cooling module or the server is immersion based packaged. As the cooling operation efficiency may be improved by minimizing the two-phase coolant to be transferred externally for cooling, the present disclosure provides techniques for optimizing coolant usage.

The disclosed distribution hardware for two phase system recirculation may be implemented to various types of data centers, flexible for various deployment scales, and improve facility cooling efficiency overall. The disclosed configurations are compatible with existing rack and server configurations and improves two-phase coolant management. Herein, coolant refers to cooling fluids that may be in one or more matter states, such as in liquid, gas or vapor, or a mixture thereof. In some examples, the proposed configuration improves separation of various states of the coolant. The disclosed coolant management hardware, which does not require coolant to first return to the source coolant supply, may reduce the required mount for the source coolant supply.

Two-phase cooling systems use the latent heat absorbed by the coolant when the coolant transforms from the liquid state into the vapor state, without requiring a change in temperature. For example, the coolant may have a low boiling point of 50 degrees Celsius. When the coolant (originally in liquid state) contacts the component to be cooled, a portion of the coolant is transformed into the vapor state to absorb the heat from the component, while maintaining the overall temperature (e.g., at the boiling point of the coolant). When excessive heat is produced, more coolant in the liquid state is required. This may be achieved by increasing the pumping speeds of the coolant from the supply line. However, when heat is produced with large discrepancy at different components or servers in the same rack (e.g., powered by the same supply pump), requiring an overall increase in the coolant feed rate would be unnecessary and wasteful. The present disclosure allows the coolant that is still in the liquid state to passively flow back to join the coolant from the supply line, thus providing flexibility of heat absorption capacity without requiring any changes in the pump feed rate. As such, the pump speeds may also be set at an economical/efficient level, improving overall operation efficiency. In this disclosure, the vapor state may refer to any gaseous state.

Existing two-phase cooling systems often do not separate the coolant in different matter states in one loop. For example, in one circulation loop or cycle, the coolant, which includes a mixture of liquid and vapor states, is transferred to a radiator or condenser and returned to the source coolant supply before being used in the next circulation cycle. Because vapor is the coolant in the gas phase at a temperature lower than the critical temperature and may be condensed to the liquid state by increasing pressure on the vapor without a change of temperature, the present disclosure provides systems and methods for separating the coolant in vapor state and in liquid state within a circulation cycle, and allows the coolant in liquid state to be merged with coolant from the supply source to continue circulating in the cooling system to achieve the advantages mentioned above.

According to aspects of the present disclosure, an example two-phase fluid cooling system may include a fluid management hardware including a liquid supply component (or region), a liquid merging component/region, and a vapor extraction component/region. The liquid supply component is configured to supply and/or distribute coolant liquid (e.g., from a supply source) to one or more servers. The liquid merging component is connected to the server coolant outlets as well as the main source supply, allowing coolant liquid portions to be merged and circulated in the cooling system. In some cases, the liquid merging component includes internal fluid valves for adjusting intake from the supply sources. The vapor extraction component is configured to separate the vapor from the two-phase coolant after absorbing heat from the servers. Within the vapor extraction component, the liquid portion of the two-phase coolant may be directed back to the liquid merging part directly and the vapor portion may be extracted out from the fluid management hardware.

In an example aspect, an electronic rack may include one or more server chassis arranged in a stack. Each of the server chassis may contain one or more electronic devices, such as computational or processing devices operable to manipulate, store, process, generate, or convert data or information. The electronic rack may also include a coolant management unit (also referred to as core unit) coupled to the one or more server chassis. The coolant management unit includes a supply region, a liquid merging region, and a separation region. The supply region is configured to receive a coolant from a source (e.g., an external coolant supply source). The liquid merging region is configured to receive the coolant from the supply region and distribute the coolant to the one or more server chassis. The coolant may operate to remove at least a portion of heat from the one or more electronic devices by transforming into a two-phase fluid (e.g., a fluid simultaneously including two matter phases, such as liquid and gas/vapor). The transformed coolant includes a liquid portion (e.g., matter in the liquid state) and a non-liquid portion (e.g., matter in the vapor state). The separation region is configured to remove the non-liquid portion from the liquid merging region.

In some embodiments, the liquid merging region includes a liquid level sensor for maintaining a liquid level in the liquid merging region. For example, the liquid level sensor maintains the liquid level based on at least two variables. First, for one circulation cycle, the more heat the coolant removes, the greater proportion of the non-liquid portion of the coolant will be transformed and become vapor to be removed from the liquid merging region. As such, more coolant liquid than that of a lower heat load is to be received at the liquid merging region from the supply region. Second, the system control may control the rate of circulation (e.g., pumping the coolant at different rates through the server chassis) based on variable heat generation at the one or more server chassis. As such, both a temperature sensor in each of the one or more server chassis and the liquid level sensor provide information to the system control to maintain the liquid level in the liquid merging region.

In some embodiments, the liquid merging region further includes a pump connecting the coolant in the liquid merging region to an inlet manifold supplying the coolant to the one or more server chassis, the pump to power the coolant cycling through the electronic rack and to maintain the liquid level in the liquid merging region based on measurements by the liquid level sensor. In some cases, the electronic rack includes at least one temperature sensor in the one or more server chassis. The pump may operate to power the coolant based on measurements by the at least one temperature sensor.

In some embodiments, the separation region includes a de-entrainment mesh pad separating the non-liquid portion from the liquid portion of the two-phase fluid; and an outlet to remove the non-liquid portion from the separation region.

In some embodiments, the liquid merging region may include a first compartment to receive the two-phase fluid from the one or more server chassis; and a second compartment to return the liquid portion of the two-phase fluid to the one or more server chassis, wherein the liquid level sensor is located in the second compartment. In some cases, both the first compartment and the second compartment are connected to the separation region for allowing at least a portion of the non-liquid portion of the two-phase fluid to be removed from the liquid merging region. In some cases, the liquid merging region further includes a one-way inlet channel connecting the first compartment to the second compartment.

In some embodiments, the coolant management unit further includes a three-way valve operable to selectively receive: the coolant received from the supply region, and/or the liquid portion of the two-phase fluid, wherein the three-way valve is to merge and supply a mixture of received fluids to the one or more server chassis.

In some embodiments, the pump is configured to draw the coolant received from the supply region and the liquid portion of the two-phase fluid and to distribute the coolant to the server chassis. The coolant management unit further includes an intake device coupled to the pump to receive the coolant from the liquid merging region; and an extended return loop coupled to the server chassis to receive the two-phase fluid. An exit end of the extended return loop is elevated higher than the intake device, such that the non-liquid portion of the two-phase fluid is further separated from the coolant drawn from the pump.

Details of the schematics and illustrative configurations are discussed below.

FIG. 1 illustrates a first example schematic of a cooling system 100 using a liquid merging region, according to an embodiment of the present disclosure. The cooling system 100 includes coolant management unit 101. At a high level, the coolant management unit 101 optimize (e.g., by minimizing) the coolant intake from external sources when not all the circulated coolant is transformed into vapor. As such, the liquid portion of the two-phase fluid circulated through the one or more servers 112 needs not be transferred externally, reducing overall power consumption.

The coolant management unit 101 is connected to a coolant source supply (e.g., the supply 105). The coolant management unit 101 includes a liquid merging region 142, a supply region 146, and a separation region 160. The liquid merging region 142 may be a container, a tank, sealed housing, tube, pips, or any liquid containing hardware component with related fixtures and connectors for receiving and containing the liquid phase coolant fluid. The separation region operates for two phase liquid separation, such as to separate the coolant vapor from the liquid merging region and remove the vapor from the coolant management unit 101.

The coolant management unit 101 operate to separate the liquid portion and the non-liquid portion of the coolant. In one example, the coolant management unit 101 includes a separation barrier 150, such as a de-entrainment unit (e.g., a mesh pad), for assisting the separation of the vapor and liquid. The separation region 160 may include a vapor outlet 152 for allowing the vapor to leave the separation region 160. The liquid portion of the coolant are kept in the liquid merging region and pumped back to be used in the one or more servers 112.

The supply region 146 of the coolant management unit 101 receives coolant via supply line 109 from a supply source 105. In some cases, the supply line 109 may be connected to the supply source 105 via an interface 107 (e.g., valves, actuators, connectors, or couplers). In some cases, the interface 107 may be configured to allow or disallow coolant from the supply 105 to enter the supply line 109. The supply region 146 may be part of the liquid merging region 142, or the supply region 146 and the liquid merging region 142 may be contained in a common container (while occupying different positions or volumes). The coolant supplied to the supply region 146 may be merged with the liquid portion of the returned coolant in the liquid merging region 142. The merged liquid 144 may then be pumped to the inlet 110 (e.g., a manifold with common conduit that supplies the coolant to respective coolant intake ports in the one or more servers 112), which distributes the coolant to the one or more servers 112.

As shown in FIG. 1, the coolant management unit 101 is connected to the inlet 110 via the pump 120. The pump 120 may pump the liquid 144 from the liquid merging region 142 of the coolant management unit 101 to the one or more servers 112 via the inlet 110. The one or more servers 112 may include one or more temperature sensors 130 providing feedback for a control device of the pump 120. For example, the pump 120 may be controlled to maintain a configured or desired temperature (or a temperature range) of the one or more servers 112. In some cases, each of the one or more servers 112 may include multiple temperature sensors 130 for measuring local temperatures at various locations about the one or more servers 112. In some cases, the temperature sensors 130 may be integrated with electronic component or devices on the one or more servers 112. The control device of the pump 120 may take into account of the local temperatures (e.g., uneven) in determining a dynamic power output of the pump 120, such as by using average, maximal, or minimal value of the local temperatures as a control input. In this embodiment, supply 105 is directly supplied to the liquid merging region, for example, from an external cooling liquid source.

The coolant management unit 101 may include a liquid level sensor 140, which indicates a current liquid level of the fluid in the liquid merging region 142. The measurements by the liquid level sensor 140 may be used to control a rate or an amount of incoming coolant from the supply 105 to be provided to the liquid merging region 142.

Figure 2A:
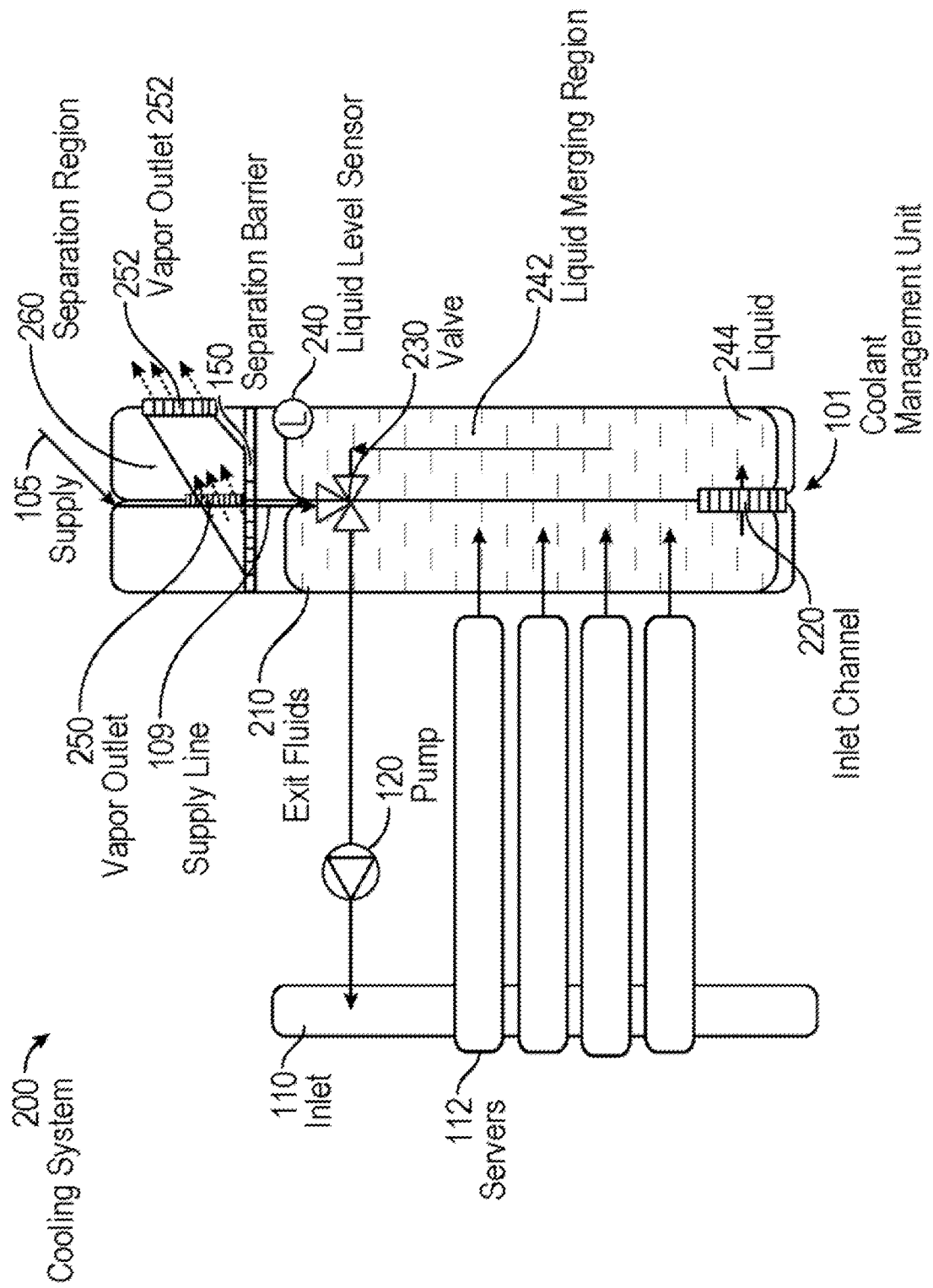
FIG. 2A illustrates a second example schematic of a cooling system using a liquid merging region, according to an embodiment of the present disclosure.

FIG. 2A illustrates a second example schematic of a cooling system 200 using a liquid merging region, according to an embodiment of the present disclosure. As shown, the coolant management unit 101 includes two compartments (or sections or regions, e.g., one for first two-phase coolant fluids, the other for second liquid portion of the two-phase coolant fluids) connected by an inlet channel 220. The first compartment of the coolant management unit 101 receives and collects the first two-phase fluids from the one or more servers 112. The exit fluids 210 may exit the first compartment via the inlet channel 220 into the second liquid merging region 242, which includes the second liquid 244.

As shown in FIG. 2, both the first and second compartments of the coolant management unit 101 are in connection with the separation region 260. When the first two-phase coolant enters the first compartment, a portion of the vapor enters the separation region 260. The separation region 260 includes two vapor outlets 250 and 252, respectively allowing the vapors from the two compartments of the coolant management unit 101 to be removed. This way, the coolant management unit 101 optimizes the separation between the liquid portion and non-liquid portion of the two-phase coolant by taking pressure level into consideration.

The liquid portion of the first two-phase coolant is managed or pumped to the second compartment of the liquid merging region 242. The liquid 244 in the liquid merging region 242 enters the valve 230 that is in connection with the supply line 109. The merged coolant may then be pumped to the one or more servers 112 via the pump 120. For example, the valve 230 may be a three-way valve with controlled actuators to selectively allow coolant supply from the supply line 109 when actuated, from the liquid merging region, or both. The control may be based on readings on the liquid level sensor 240. For example, coolant supply from the supply line 109 may be allowed to enter the cooling system 200 when the liquid level in the liquid merging region 242 as measured by the liquid level sensor 240 is below a threshold value.

In some embodiments, the three-way valve 230 is operable to receive liquid 244 from the liquid merging region 242. For example, the liquid 244 may include the coolant received from the supply line 109 or a supply region such as the supply region 146, and the liquid 244 of the two-phase fluid (e.g., the liquid portion of the exit fluids 210) in the second compartment (e.g., the right compartment). The exit fluids 210 exiting from the one or more server chassis in the left compartment may enter the right compartment via the inlet channel 220, which may be located near the bottom of the compartments. This is due to that the pump intake is located at the right compartment intaking fluid, generating a relative low pressure in the second compartment. In some cases, the inlet channel 220 allows the fluid flowing from the first compartment to the second compartment (e.g., equalizing pressure levels of the left and right compartments) to be measured by the liquid level sensor 240. Note that valve 230 may be located in the left compartment or the right compartment, as long as it intakes the fluid from the right compartment.

The three-way valve 230 is operable to merge and supply a mixture of the received fluids to the one or more servers 112. For example, the three-way valve 230 may merge at least one of the exit fluids 210, the liquid 244, or the coolant from the supply line 109 based on cooling demands or based on the liquid level indicated by the liquid level sensor 240 as discussed above.

Figure 2B:
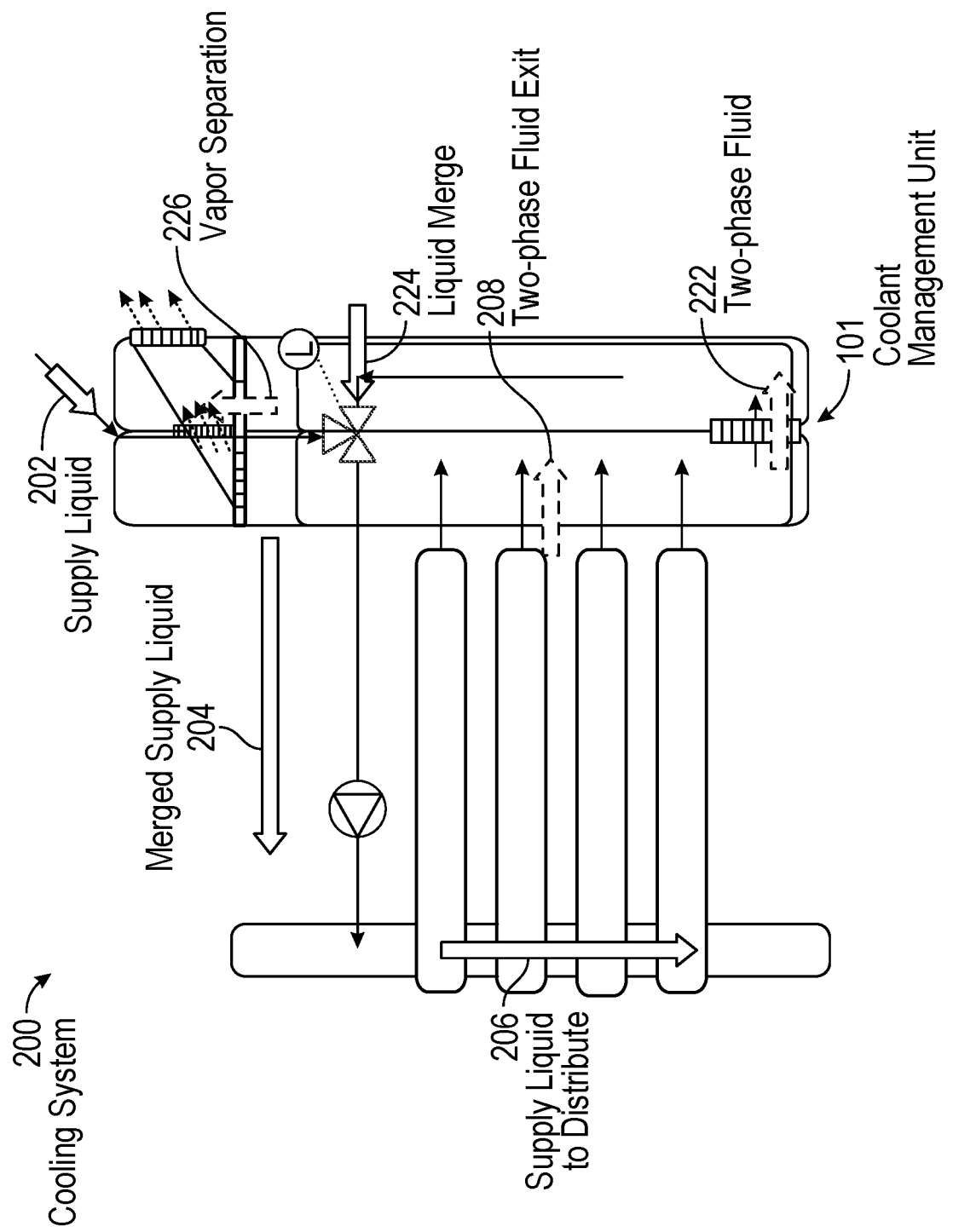
FIG. 2B illustrates an example of operation of the cooling system of FIG. 2A, according to an embodiment of the present disclosure.

FIG. 2B illustrates an example of operation of the cooling system 200 of FIG. 2A, according to an embodiment of the present disclosure. The operation is indicated by a series of arrows indicating the state and the circulation of the two-phase coolant in the cooling system 200. The arrows use two different line types, solid and dash, to indicate whether the two-phase coolant is primarily in liquid state or in a mixed state including both liquid and vapor. For example, referring to both FIGS. 2A and 2B, the supply liquid 202 enters the cooling system 200 from the source supply 105. The supply liquid 202 may then merge with the liquid 224 from the liquid merging region 242. The pump 120 then transfers the merged supply liquid 204 to the inlet 110, which distribute the supply liquid 206 to the one or more servers 112. The exiting two-phase fluid 208 exits the one or more servers 112 and enters the first compartment of the coolant management unit 101. The two-phase fluid 222 returns to the liquid merging region 242 via the inlet channel 220. Again, in this embodiment, the pump intakes the fluid from the second/right compartment.

Figure 3:
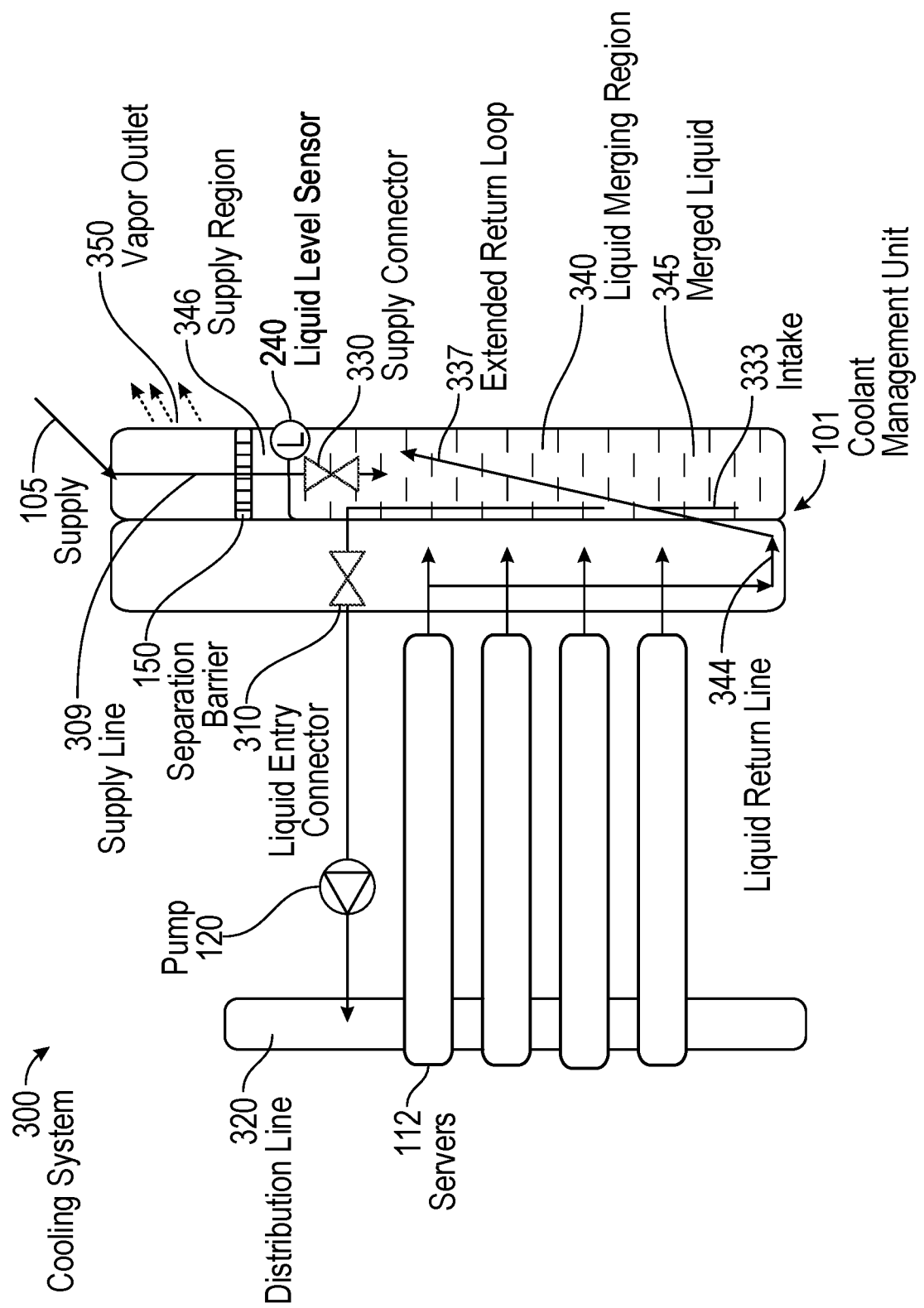
FIG. 3 illustrates a third example schematic of a cooling system using a liquid merging region, according to an embodiment of the present disclosure.

FIG. 3 illustrates a third example schematic of a cooling system 300 using a liquid merging region, according to an embodiment of the present disclosure. Compared to the cooling system 200, the cooling system 300 separates the three-way valve 230 into two distinct devices: the supply valve 330 and the liquid entry valve 310. In addition, instead of having a separation region for two-phase fluids of different pressure levels, the supply region 346 manages liquid-vapor separation only for the liquid merging region 340. A liquid return line 344 is provided to transfer the two-phase fluids from the one or more servers 112 to the liquid merging region 340. The two-phase fluids are may then be recirculated to the one or more servers 112 via the intake 333.

In some embodiments, the liquid return line 344 may be configured to form an extended return loop 337. As shown in FIG. 3, the extended return loop 337 may include an outlet or exit end in an elevated position (e.g., when FIG. 3 illustrated as a side view), higher than the position of the intake port or device 333 and close to the separation barrier 150. Thus, the non-liquid portion of the two-phase fluid (e.g., vapor) exits the return loop into the liquid merging region at an elevated position higher than intake 333. This way, the extended return loop 337 may assist vapor separation (e.g., removing impediment against vapor in the two-phase fluid being separated due to pressure created by the liquids in the liquid merging region 340). In such design, the position of 337 and 333 assist that minimum to no vapor intaking by the pump intake 333. And all vapor goes to the top portion of the liquid merging region.

Other aspects of the cooling system 300 are similar to the corresponding components in the cooling system 200. For example, the merged liquid 345 in the liquid merging region 340 may be merged from the liquid portion of the two-phase fluids from the one or more servers 112 and the liquid from the supply line 309. The liquid from the supply line 309 is controlled by the valve 330 based on the measurements by the liquid level sensor 240. The supply region 346 may include the space including hardware needed for providing the coolant supply from the supply line 309. The vapor of the two-phase fluids from the one or more servers 112 exits vapor outlet 350. In some cases, at least part of the vapor is separated by the separations barrier 150. A distribution line 320 (similar to the inlet 110) further transfers the liquid to the one or more servers 112 to conduct the cooling cycle.

Figure 4:
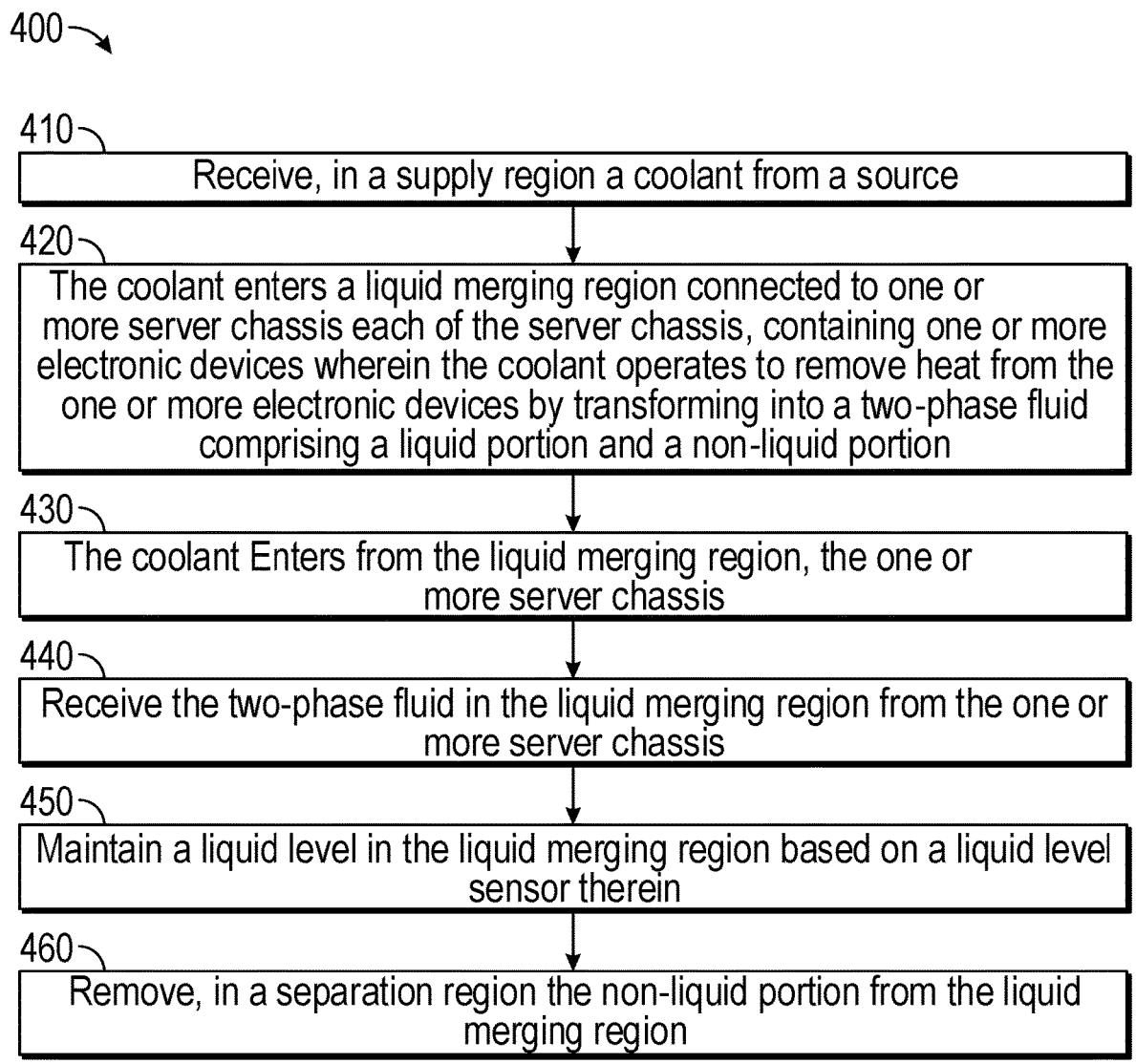
FIG. 4 is a flow chart of example operations of a cooling system, according to an embodiment of the present disclosure.

FIG. 4 is a flow chart of example operations 400 of a cooling system using liquid merging region, according to an embodiment of the present disclosure. The operations 400 may be performed by a cooling system, such as the cooling systems 100-300 of FIGS. 1-3, to maintain an optimal operation temperature by removing heat in one or more servers.

The operations 400 may begin, at block 410, by receiving, in a supply region, a coolant from a source. In some cases, the coolant may be a two-phase fluid having a low boiling temperature (e.g., 50 degrees Celsius).

At block 420, the operations 400 cause the coolant to enter a liquid merging region connected with outlet one or more server chassis. Each of the server chassis contains one or more electronic devices. The coolant operates to remove heat from the one or more electronic devices by transforming into a two-phase fluid comprising a liquid portion and a non-liquid portion.

At block 430, the coolant to enters, from the liquid merging region, the one or more server chassis. For example, a pump is used to draw the coolant from the liquid merging region and distribute the coolant to the server chassis.

At block 440, the two-phase fluid exiting from the one or more server chassis is received in the liquid merging region, which may be merged with the coolant received from an external source. At block 450, the liquid merging region maintains a liquid level based on a liquid level sensor therein. At block 460, the non-liquid portion is removed, in a separation region, from the liquid merging region.

Figure 5:
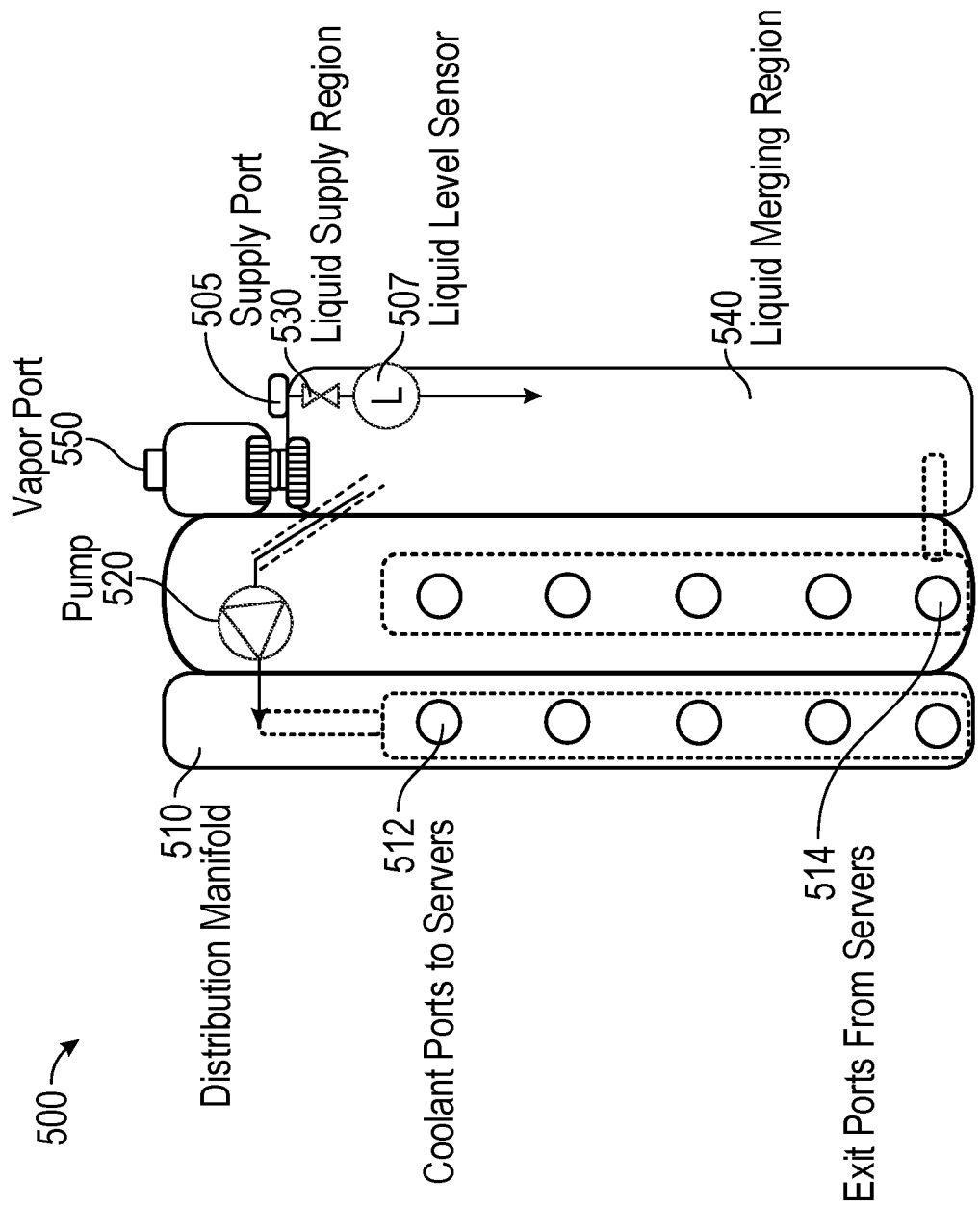
FIG. 5 illustrates an example hardware implementation of a coolant management unit of the second example schematic of FIG. 2A, according to an embodiment of the present disclosure.

FIG. 5 illustrates an example compact hardware packaging and implementation of a coolant management unit 500 of the second example schematic of FIG. 2A, according to an embodiment of the present disclosure. The coolant management unit 500 illustrates a modular design that can be used for improving the solution flexibility and compatibility with different server racks and/or hardware systems.

As shown, the coolant management unit 500 may include one or more modules to form the liquid merging region 540 and the liquid supply region 530. Above the module of the liquid merging region 540 is a separation structure, which includes a vapor port 550. The liquid supply region 530 may include a supply port 505 (or a source port, such as a coolant source port). In some cases, various sensors and/or fluid units are fully integrated to the cooling system assembly. For example, the coolant management unit 500 may include a liquid level sensor 507 integrated in the liquid merging region 540 or the supply port 505.

A pump 520 may be included in a common module of the coolant management unit 500 that also includes exit ports 514 for receiving two-phase coolant from the one or more servers. A distribution manifold module 510 includes a number of coolant ports 512 to the servers. As such, the modular coolant management unit 501 may interface with existing servers by directly connecting the coolant ports 512, exit ports 514, supply port 505, and vapor port 550 with respective ports in rack cooling systems. As such, the coolant management unit 500 includes a number of modules that support plug-and-play, which are compatible with existing server liquid cooling connectors.

In general, an electronic rack applicable with the present disclosure may include any of the electronic racks as described throughout this application. According to one embodiment, an electronic rack includes, but is not limited to, a supply line, a rack management unit (RMU), and one or more server chassis. Server chassis can be inserted into an array of server slots (e.g., standard shelves) respectively from frontend or backend of electronic rack. Each server chassis may include one or more blade slots to receive one or more server blades. Each server blade represents one or more servers therein.

Any number of server chassis may be maintained within electronic rack. The particular positions of heat exchanger, RMU, and/or server chassis may be configured in various manners. In one embodiment, electronic rack can be either open to the environment or partially contained by a rack container, as long as the cooling fans can generate airflows from the frontend to the backend.

In addition, for at least some of the server chassis, an optional fan module is associated with the server chassis. Each of the fan modules includes one or more cooling fans. The fan modules may be mounted on the backends of server chassis or on the electronic rack to generate airflows flowing from frontend, traveling through the air space of the sever chassis, and exiting at backend of electronic rack.

In one embodiment, the supply line may provide coolant in liquid phase from a source to the rack. In some cases, the supply line may be powered by a pump to supply coolant to the server chassis. The coolant may be a two-phase coolant. The separator separates the coolant in the vapor state from the coolant in liquid state. The coolant in the liquid state may return to the supply line via a pump-free conduit, such as by using gravity, surface tension, or other pump-free means. In some cases, one or more pumps may be used between the supply line and one or more individual sub-cooling systems in each of the server chassis.

Each of server chassis may include one or more information technology (IT) components (e.g., electronic devices such as processors, memory, and/or storage devices). The coolant removes the heat generated from the electronic device attached thereon. The coolant carrying the exchanged heat exits the server chassis via conduits and reaches one or more separators, which separates the coolant in liquid state from the coolant in vapor state. The coolant in liquid state is returned to the supply line via the pump-free conduits.

In another embodiment, some of the server chassis may include an immersion tank containing immersion coolant therein. The electronic devices of the corresponding server (s) are at least partially submerged into the immersion coolant. The immersion coolant may be dielectric cooling fluid, which may be circulated between the immersion tanks and heat exchanger (not shown). The coolant may be a single-phase coolant or two-phase coolant (also referred to as phase-change coolant). The two-phase coolant evaporates from a liquid form into a vapor form when the temperature of the coolant is above a predetermined temperature threshold (e.g., the boiling point of the coolant). The vapor flows upstream via the vapor line associated with one or more separators from the corresponding server chassis to heat exchanger. Heat exchanger may include a condenser to condense the vapor from the vapor form back to the liquid form, where the coolant is then supplied back to the server chassis.

Note that some of the server chassis may be configured with single-phase liquid cooling, while other server chassis may be configured with two-phase liquid cooling. Even within a single server chassis, some of the IT components may be configured with single-phase liquid cooling, while other IT components may be configured with two-phase liquid cooling. A rack manifold may include a first rack manifold for single-phase cooling and a second rack manifold for two-phase cooling to be coupled to the same or different server chassis for different types of cooling. Some of the sever chassis may be configured with regular liquid and air cooling, while other server chassis may be configured with immersion cooling.

Some of the IT components may perform data processing tasks, where the IT components may include software installed in a machine-readable medium such as a storage device, loaded into a memory, and executed by one or more processors to perform the data processing tasks. Server chassis may include a host server (referred to as a host node) coupled to one or more compute servers (also referred to as computing nodes). The host server (having one or more central processing units or CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the computing nodes or compute servers (having one or more graphics/general processing units or GPUs) managed by the host server. The compute servers perform the actual tasks, which may generate heat during the operations.

Electronic rack further includes optional RMU configured to provide and manage power supplied to servers and heat exchanger. RMU may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.,) to provide power to at least some of the remaining components of electronic rack.

In one embodiment, RMU includes optional optimization module and rack management controller (RMC). RMC may include a monitor to monitor operating status of various components within electronic rack, such as, for example, computing nodes, heat exchanger, and the fan modules. Specifically, the monitor receives operating data from various sensors representing the operating environments of electronic rack. For example, the monitor may receive operating data representing temperatures of the processors, coolant, and airflows, which may be captured and collected via various temperature sensors. The monitor may also receive data representing the fan power and pump power generated by one or more fan modules and liquid pumps, which may be proportional to their respective speeds. These operating data are referred to as real-time operating data. Note that the monitor may be implemented as a separate module within RMU.

Based on the operating data, optimization module performs an optimization using a predetermined optimization function or optimization model to derive a set of optimal fan speeds for the fan modules and an optimal pump speed for a liquid pump, such that the total power consumption of the liquid pump and the fan modules reaches minimum, while the operating data associated with the liquid pump and cooling fans of the fan modules are within their respective designed specifications. Once the optimal pump speed and optimal fan speeds have been determined, RMC configures the liquid pump and cooling fans of the fan modules based on the optimal pump speeds and fan speeds.

In the foregoing specification, embodiments of the present disclosure have been described with reference to specific exemplary embodiments thereof. It will be evident that various modifications may be made thereto without departing from the broader spirit and scope of the present disclosure as set forth in the following claims. The specification and drawings are, accordingly, to be regarded in an illustrative sense rather than a restrictive sense.

What is claimed is:

1. An electronic rack, comprising:
   one or more server chassis arranged in a stack, each of the server chassis containing one or more electronic devices; and
   a coolant management unit coupled to the one or more server chassis, the coolant management unit including:
   a supply region to receive a coolant from a source,
   a liquid merging region to receive the coolant from the supply region and to distribute the coolant to the one or more server chassis, wherein the coolant operates to remove at least a portion of heat from the one or more electronic devices by transforming into a two-phase fluid comprising a liquid portion and a non-liquid portion, and wherein the liquid merging region is to receive the two-phase fluid, and
   a separation region to remove the non-liquid portion from the liquid merging region, and
   a three-way valve operable to selectively receive: the coolant received from the supply region, and/or the liquid portion of the two-phase fluid, wherein the three-way valve is to merge and supply a mixture of received fluids to the one or more server chassis.

2. The electronic rack of claim 1, wherein the liquid merging region comprises a liquid level sensor for maintaining a liquid level in the liquid merging region.

3. The electronic rack of claim 2, wherein the liquid merging region further comprises:
   a pump connecting the coolant in the liquid merging region to an inlet manifold supplying the coolant to the one or more server chassis, the pump to power the coolant cycling through the electronic rack and to maintain the liquid level in the liquid merging region based on measurements by the liquid level sensor.

4. The electronic rack of claim 3, further comprising at least one temperature sensor in the one or more server chassis, and the pump to power the coolant further based on measurements by the at least one temperature sensor.

5. The electronic rack of claim 1, wherein the separation region comprises:
   a de-entrainment mesh pad separating the non-liquid portion from the liquid portion of the two-phase fluid; and
   an outlet to allow the non-liquid portion to exit from the separation region, wherein the non-liquid portion comprises vapor.

6. The electronic rack of claim 2, wherein the liquid merging region comprises:
   a first compartment to receive the two-phase fluid exiting from the one or more server chassis; and
   a second compartment to receive the two-phase fluid from the first compartment and to return the liquid portion of the two-phase fluid to the one or more server chassis, wherein the liquid level sensor is located in the second compartment.

7. The electronic rack of claim 6, wherein both the first compartment and the second compartment are connected to the separation region for allowing at least a portion of the non-liquid portion of the two-phase fluid to be removed from the liquid merging region.

8. The electronic rack of claim 3, wherein the pump is configured to draw the coolant received from the supply region and the liquid portion of the two-phase fluid and to distribute the coolant to the server chassis.

9. The electronic rack of claim 8, wherein the coolant management unit further comprises:
   an intake device coupled to the pump to receive the coolant from the liquid merging region; and
   an extended return loop coupled to the server chassis to receive the two-phase fluid, wherein an exit end of the extended return loop is elevated higher than the intake device, such that the non-liquid portion of the two-phase fluid is further separated from the coolant drawn from the pump.

10. A cooling system, comprising:
    a fluid supply line to receive cooling fluid from a cooling fluid source;
    a fluid return line to return the cooling fluid to the cooling fluid source;
    a plurality of electronic racks coupled to the fluid supply line and the fluid return line, wherein each of the plurality of electronic racks comprises a coolant management unit comprising:
    a supply region to receive a coolant from a source;
    a liquid merging region to receive the coolant from the supply region and to distribute the coolant to one or more server chassis, each of the server chassis containing one or more electronic devices, wherein the coolant operates to remove heat from the one or more electronic devices by transforming into a two-phase fluid comprising a liquid portion and a non-liquid portion, and wherein the liquid merging region is to receive the two-phase fluid and comprises a liquid level sensor for maintaining a liquid level in the liquid merging region; and
    a separation region adjacent to the liquid merging region to remove the non-liquid portion from the liquid merging region, and
    a three-way valve operable to selectively receive: the coolant received from the supply region, and/or the liquid portion of the two-phase fluid, wherein the three-way valve is to merge and supply a mixture of received fluids to the one or more server chassis.

11. The cooling system of claim 10, wherein the liquid merging region in each of the plurality of electronic racks further comprises:
    a pump connecting the coolant in the liquid merging region to an inlet manifold supplying the coolant to the one or more server chassis, the pump to power the coolant cycling through the electronic rack and to maintain the liquid level in the liquid merging region based on measurements by the liquid level sensor.

12. The cooling system of claim 11, wherein each of the plurality of electronic racks further comprises at least one temperature sensor in the one or more server chassis, and the pump to power the coolant further based on measurements by the at least one temperature sensor.

13. The cooling system of claim 10, wherein the separation region in each of the plurality of electronic racks comprises:
    a de-entrainment mesh pad separating the non-liquid portion from the liquid portion of the two-phase fluid; and
    an outlet to remove the non-liquid portion from the separation region.

14. The cooling system of claim 10, wherein the liquid merging region in each of the plurality of electronic racks comprises:

a first compartment to receive the two-phase fluid exiting from the one or more server chassis; and a second compartment to receive the two-phase fluid from the first compartment and to return the liquid portion of the two-phase fluid to the one or more server chassis, wherein the liquid level sensor is located in the second compartment.

15. The cooling system of claim 14, wherein both the first compartment and the second compartment are connected to the separation region for allowing at least a portion of the non-liquid portion of the two-phase fluid to be removed from the liquid merging region.

16. The cooling system of claim 11, wherein the pump is configured to draw the coolant received from the supply region and the liquid portion of the two-phase fluid and to distribute the coolant to the server chassis.

17. The cooling system of claim 16, wherein the coolant management unit further comprises:

an intake device coupled to the pump to receive the coolant from the liquid merging region; and an extended return loop coupled to the server chassis to receive the two-phase fluid, wherein an exit end of the extended return loop is elevated higher than the intake device, such that the non-liquid portion of the two-phase fluid is further separated from the coolant drawn from the pump.

18. A method for recycling a liquid portion of a used two-phase cooling fluid in an electronic rack, the method comprising:

receiving, in a supply region, a coolant from a source;

causing the coolant to enter a liquid merging region connected to one or more server chassis, each of the server chassis containing one or more electronic devices, wherein the coolant operates to remove heat from the one or more electronic devices by transforming into a two-phase fluid comprising a liquid portion and a non-liquid portion;

causing the coolant to enter, from the liquid merging region, the one or more server chassis;

receiving the two-phase fluid in the liquid merging region from the one or more server chassis;

selectively receiving at a three-way valve, the coolant from the supply region, and/or the liquid portion of the two-phase fluid;

merging and supplying, by the three-way valve, a mixture of received fluids to the one or more server chassis;

maintaining a liquid level in the liquid merging region based on a liquid level sensor therein; and removing, in a separation region, the non-liquid portion from the liquid merging region.

* * * * *